United States Patent [19]

Hrzek

[11] 3,801,365

[45] Apr. 2, 1974

[54] METHOD FOR PRODUCING AN ELECTRICAL DEVICE

[75] Inventor: Bohuslav A. Hrzek, Troy, Mich.

[73] Assignee: Energy Conversion Devices, Inc., Troy, Mich.

[22] Filed: Aug. 5, 1971

[21] Appl. No.: 169,253

[52] U.S. Cl. .............. 117/212, 117/106 R, 117/118, 117/215, 117/229, 148/174

[51] Int. Cl. .............. C23c 11/08

[58] Field of Search .............. 117/212, 217, 107.2 R, 117/227, 229, 118, 106 R, 106 A, 215; 148/174; 317/235 UA

[56] References Cited

UNITED STATES PATENTS

| | | | |
|---|---|---|---|
| 3,477,872 | 11/1969 | Amick | 117/212 |
| 3,669,730 | 6/1972 | Lepselter | 117/212 X |
| 3,480,475 | 11/1969 | Inoue et al. | 117/227 |
| 3,252,823 | 5/1966 | Jacobson et al. | 117/107.2 R X |
| 3,455,754 | 7/1969 | Kern | 117/118 |

*Primary Examiner*—Ralph S. Kendall
*Assistant Examiner*—J. Massie

[57] ABSTRACT

A conductive layer is deposited on the surface of a reactive electrically resistive material, such as a silicon semiconductor, by contacting the surface with a gaseous mixture of a hydrogen-reducible metal halide, such as molybdenum pentachloride, and hydrogen in an amount which is insufficient for the complete reduction of the metal halide. The surface of the material is heated during the deposition to a reaction temperature which is below the temperature required for the hydrogen reduction of the metal halide to the respective metal but high enough to permit the formation of the metal reaction product of the reactive electrically resistive material. The method is selective, resulting in the deposition of the conductive layer on the reactive electrically resistive surface, but not on any non-reactive insulator or semiconductor layer which may be contained thereon.

Also semiconductor devices, such as a silicon chip having various doped regions forming circuit elements, and an insulating layer thereon. For example, in an aperture in the insulating layer, opposite and in ohmic contact with a doped region, is provided an electrically conductive layer of molybdenum silicides. Thereover and in contact with the conductive layer may be a layer of a semiconductor memory material, forming an electrical switch.

Also compact, complex circuitry employing the novel ohmic conductive layer.

26 Claims, 4 Drawing Figures

BOHUSLAV A. HRZEK
INVENTOR.

BY Edward D. Fiorito
ATTORNEY

METHOD FOR PRODUCING AN ELECTRICAL DEVICE

The invention relates to a new method for producing electrical devices and more particularly to a method for providing a conductive layer on an electrically resistive material and to new electrical and semiconductor devices.

In the manufacture of P-N-junction devices, the silicon wafer or chip is generally provided with a thin coating of silicon dioxide, for example, by steam oxidation or pyrolytic oxidation to provide the desired electrical insulator. Thereafter, the areas of the silicon dioxide coating, not wanted, are removed by coating of the wafer with a suitable photoresist, exposing through a suitable photomask to UV-light and removal, for example, by dissolution, of the unexposed areas of the photoresist. The bared areas of the silicon dioxide surface are thereafter dissolved by treatment with hydrofluoric acid or the like, to produce a desired pattern of bare silicon areas. After removal of the exposed photoresist, contacts may be provided by depositing a metal onto the bare silicon areas. Aluminum is often used for providing an ohmic contact with the P-material or N-material. The aluminum is usually applied to the wafer by vacuum deposition techniques or by sputtering, covering not only the silicon in the bared areas but also the insulating layer of silicon dioxide in form of a continuous metal layer. It is therefore necessary to repeat the application of a photoresist, exposing through a photomask, washing out the unexposed areas of the photoresist, and etching away the undesired part of the aluminum coating. Thereafter, the exposed photoresist is removed and the wafer is subjected to an alloying process, including exactly controlled heating, to make intimate contact between the silicon and the aluminum metal contained thereon, and to provide at the interface between these materials the required ohmic contact. This procedure is time-consuming and costly and results in contacts of irregular, ragged structure.

Sugano et al report in the Japanese Journal of Applied Physics, Volume VII, No. 9, Sept. 1968, the chemical deposition of molybdenum onto silicon for the production of Schottky diodes. Molybdenum pentachloride is sublimated and carried by an excess of hydrogen gas to the silicon wafer. For the deposition of a continuous film of molybdenum metal, the wafer is heated to a temperature from about 500°C. to about 800°C. At temperatures lower than 500°C., for example, at 400° C. a mixture of molybdenum metal and molybdenum dichloride is deposited. At temperatures higher than 800°C., for example, at 900°C. to 1,000°C. a mixture of molybdenum metal and molybdenum silicide is deposited. Regardless of the temperature at which the deposition is made, the film of molybdenum metal or of the mentioned compounds thereof deposits not only on the bare silicon surfaces, but also on any other surface being heated to the deposition temperature. A silicon wafer, comprising a coating of insulating silicon dioxide and a pattern of apertures exposing areas of bare silicon, is therefore completely covered by the molbydenum film. To make locally confined contacts on the bare silicon areas, it is therefore necessary to remove the molybdenum in the insulating areas. This can be achieved by the complex and time-consuming photoresist method as described before in connection with the conventional aluminum contacts. No advantages in the manufacturing steps are therefore achieved by the use of the molybdenum deposition method described in the Japanese citation.

As stated hereinabove, if the deposition temperature in the method of the Japanese reference is increased to above 800°C., and especially into the range of 1,000°C. a mixture of molybdenum metal and molybdenum silicide is deposited. However, the deposition is non-selective and the deposited film extends all over the structure covering semiconductor areas and insulating areas alike.

A film containing the molbydenum silicide cannot be selectively etched, for instance, by the above described photoresist method. The film can be dissolved in a mixture of hydrofluoric acid and nitric acid, however, as is readily apparent, this etching agent also attacks and dissolves silicon dioxide and in part silicon. Therefore, in an attempt to remove the molybdenum silicide layer selectively from the areas consisting of the silicon dioxide insulator, the etching agent removes also the insulating silicon dioxide layer. Thus, the just described method is not selective, even with the use of the complex photoresist method described above. The method of the Japanese reference can therefore not be used for the provision of locally confined molybdenum silicide ohmic contact in selected areas, which are surrounded by insulating areas, as is customary and required in more complex semiconductor circuitry.

It was found, in accordance with the invention, that the deposition of the conductive layer can be made selective, such that the conductive layer deposits only in the areas formed by bare silicon, while no continuous film of conductive material is formed in the areas consisting of the insulator such as silicon dioxide.

The selectivity of the deposition is achieved by lowering the deposition temperature below that temperature, at which the vaporized molybdenum pentachloride is completely reduced by the hydrogen to the metallic form and by reducing the amount of hydrogen present in the reaction below that amount which is theoretically required for complete reduction of the molybdenum pentachloride to the metallic form. In this manner, a deposit of molybdenum silicide is selectively formed on the surfaces represented by elementary silicon, which may be doped or not doped as the case may be. As is evident from the recited Japanese publication, molybdenum silicides form normally on silicon surfaces only at temperatures of about 800°C. or higher. At these high temperatures, molybdenum silicide is formed also on the insulating surface consisting of silicon dioxide.

In the new method of the invention, the deposition of the conductive layer or film is selective and takes place only in the areas of bared silicon. A subsequent etching step is therefore not required, and the complex photoresist procedure can be omitted. Furthermore, since no etching takes place, there is no undercut or partial overlay with the insulating layer. Conductive layers having clean edges, exactly corresponding to the area of the bare silicon are produced, providing for a better product of better electrical characteristics and better utility. The molybdenum silicides, deposited by the method of the invention, have good electrical conductivity, sufficient for all semiconductor applications, and provide excellent ohmic contact without the need for a separate alloying or heat treating step as is used, if the contact layer is made from aluminum.

The new method of the invention may also be employed for the deposition of a conductive layer on semiconductor material other than silicon and on certain insulator materials. It is also useful for the deposition of compounds of metals other than molybdenum. Accordingly, the invention makes it possible to produce a conductive layer on the surface of any reactive electrically resistive material thereby providing good mechanical contact and adherence between these materials. In the case of semiconductors, excellent ohmic contact is provided between the semiconductor substrate and the conductive layer deposited thereon in accordance with the invention. The method comprises contacting the surface of the electrically resistive material with a mixture, which comprises hydrogen and a metal halide, which can be volatilized, can be reduced by hydrogen in the vapor phase and which is capable of forming an electrically conductive metal compound with the electrically resistive material. The hydrogen is present in the mixture in an amount, which is insufficient for the complete reduction of the metal halide to the respective metal. The surface of the electrically resistive material is heated, while it is contacted by the mixture of the metal halide and hydrogen, to a temperature which is lower than that required for the hydrogen reduction of the metal halide to the metal form.

Preferably, the mixture contains the metal halide in sublimated or in finely dispersed form. Since only relatively small amounts of hydrogen are used, it is also beneficial to employ a carrier gas for the metal halide. Any indifferent gas, being not reactive with the components of the reaction, may be employed as the barrier gas, such as argon or helium being most preferred. It was found that usually best selective deposition of the desired ohmic contact material is obtained, if hydrogen is used in an amount, which corresponds to from about one hundredths to about one tenth of the amount which is theoretically required for the complete reduction of all the metal halide contained in the gaseous mixture to form the corresponding metal. Molybdenum and tungsten are most preferred as the metals in the metal halides, whereby the chlorides, such as the pentachlorides are most conveniently used because of their ready availability and favorable cost.

It is believed that the metal pentachloride, when it is contacted with the heated surface of the silicon, gives off elementary chlorine, forming the corresponding subchloride and possibly a halogen-containing hydrogen compound of the metal. The elementary chlorine, in statu nascendi, reacts with the silicon to form the corresponding silicon chloride which in turn may react with the metal subchloride to form various metal silicides. These reactions proceed at temperatures below those required for the reduction of the metal chloride to the metal. On the other hand, the temperature of the semiconductor substrate must be high enough to favor and make possible the cleavage of the metal halide starting material with the formation of halogen in statu nascendi or the formation of the respective metal compound of the semiconductor substrate by any other chemical reaction mechanism.

Generally, those metal halides are preferred which are capable of forming a subhalide, though with the addition of elementary halogen to the mixture also such metal halides may be used, which do not form stable subhalides. In either case, the reaction temperature should not be high enough to permit the competing reaction between the halogen and hydrogen, with the formation of the respective hydrogen halides, to prevail.

The method of the invention is useful for the deposition of a conductive layer on a variety of electrically resistive materials including the various semiconductor materials and also insulator materials. Generally, all those materials may be used as the substrate for the deposition, which are capable of forming, under the reaction condutions of the method of the invention, the respective compounds of the metal used in the reaction mixture with the element or elements of the substrate material. Accordingly, those electrically resistive materials are most suitable, which are in their elementary form such as silicon or germanium. Generally, oxygenated materials, such as silicon dioxide or germanium oxide, do not react under the reaction conditions of the method and no conductive layer is deposited thereon. Therefore, for selectivity of the method, the semiconductor, insulator or other material, whereon the conductive layer is to be deposited, should beneficially be in the non-oxygenated and preferably in the elementary form. The insulator, semiconductor or other surface, where no deposition of the conductive layer is desired, should be preferably in the oxygenated or otherwise combined form, in which it is non-reactive with the reaction mixture under the reaction conditions of the method of the invention.

The new method of the invention is generally useful for the production of electrical devices requiring the selective deposition of a layer on a surface consisting of electrically resistive materials. If a surface comprises, for instance, in a certain area or areas a first electrically resistive material, which is capable of reaction with the herein described reaction mixture at the described reaction temperature, and in a certain other area or areas a second electrically resistive material, which is not capable of reacting with the above-said reaction mixture at the stated reaction temperature, a layer will be selectively deposited only in those areas which comprise a material which reacts with the reaction mixture at the specific selected reaction temperature.

In this embodiment of the method of the invention either one of the electrically resistive materials may be a semiconductor and the other may be an insulator or both electrically resistive materials may be insulators of different chemical composition, or both may be semiconductors of different chemical composition. Depending on the nature of the substrate material, which does react with the reaction mixture, the layer deposited by the method may be an electrical conductor, a semiconductor or an insulator. In this manner, any desired combination of semiconductor and/or insulator substrate with a conductive, or insulating layer being selectively deposited in selected areas, may be produced to permit the manufacture, by the method of the invention, of a wide variety of electrical devices, at lower cost and by simpler procedure, than has been possible hereinbefore. Generally preferred and most important is the embodiment of the method of the invention, wherein a conductive layer is selectively deposited on a semiconductor to provide ohmic contact therewith.

The preferred embodiment of the method for the selective deposition of a contact-forming, electrically conductive material onto a semiconductor material may be employed with particular benefit for the production of such devices as silicon P-N junction diodes and transistors. In these devices, the metal silicide, such as molybdenum silicide, is selectively deposited in one or more apertures in an insulating layer of oxidized silicon to form ohmic contact with the junction material as may be desired. The metal silicide may be used directly as the contact for making electrical connections in conventional manner, or other contact-giving metals such as aluminum or molybdenum may be deposited into contact with the metal silicide contact to form leads or electrical connections.

The new method is particularly useful for the production of space-saving, vertially stacked devices comprising for instance, a diode or transistor onto which is deposited a semiconductor memory material to form a circuit containing an electrical switch. Suitable memory materials and memory switches are described for instance in U.S. Pat. No. 3,271,591 issued on Sept. 6, 1966, to S. R. Ovshinsky. The method of the invention is also excellently suited for the production of compact, complex circuitry containing a large number of active and passive devices and the electrical connections therefore. The greatest benefits are obtained in microcircuits of this type.

Other objects, advantages and features of the invention will become apparent to those skilled in the art from the following description and claims of the invention and from the attached drawings in which:

Figure 1:
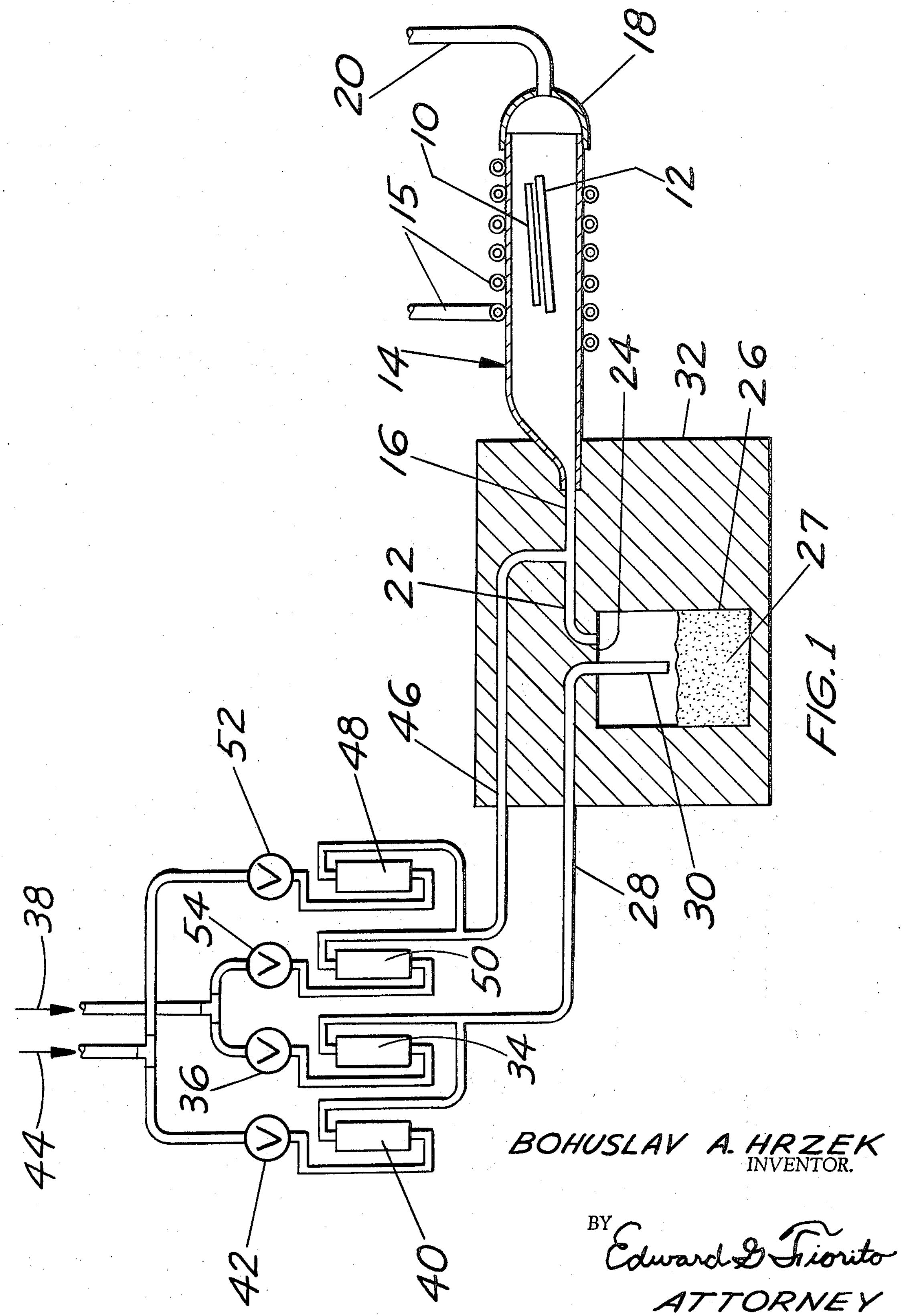
FIG. 1 is a schematic representation of an apparatus, which may be beneficially used for the practice of the method of the invention.

Referring to FIG. 1, a wafer 10 of silicon, comprising micropores in an insulating silicon dioxide coating, is placed on support 12. The micropores may have any desired size having a diameter of as low as 1 micron or less up to many hundreds of microns. The bottom of each micropore is formed by the bare silicon substrate. Instead of using a wafer having pores in an insulating layer, a wafer or chip of silicon may be used in which the whole surface consists of silicon containing no insulator on its surface.

Support 12 and wafer 10 are contained in a slanted position of, for instance, about 5° from the horizontal in reactor tube 14, which comprises heater 15, such as an RF-heating unit. Reactor tube 14 has a gas inlet 16 on one side and removable cap 18 with vent 20 on the other side. Gas inlet 16 of the reactor tube 14 is connected by tubing 22 to the outlet 24 of sublimator 26. Gas tube 28 connects to gas inlet 30, which extends to a position closely above the supply of molybdenum pentachloride 27, contained in the sublimator 26. Sublimator 26, gas tube 22, the inlet portion of reactor tube 14 and part of gas tube 28 are contained in a heater 32, the temperature of which can be very accurately adjusted by conventional control means (not shown). Gas tube 28 is connected, over flow meter 34 and flow control valve 36, to a supply of compressed hydrogen 38 and over a branch line and over flow meter 40 and control valve 42 to a supply of compressed argon 44. A branch line 46, connecting into gas tube 22 and partially contained in heater 32 is connected, over flow meters 48 and 50, respectively, and over flow control valves 52 and 54, respectively, to the supply 38 of hydrogen and to the supply 44 of argon, respectively.

For the operation of the method of the invention in the just described device, valves 36 and 42, respectively, are adjusted to provide a slow flow of a mixture of argon and hydrogen through gas tube 28, gas inlet 30 and over the surface of the heated molybdenum pentachloride 27 contained in sublimator 26. A typical flow rate of the gas mixture through gas tube 28 in an apparatus accommodating silicon wafers of about 2 inches diameter is 6.5 liters per minute, whereby the gas mixture may comprise, for instance, 1.5 percent by volume hydrogen and 98.5 percent by volume argon.

The molybdenum pentachloride 27 in sublimator 26 is heated and maintained by the heater 32 at the desired sublimation temperature of, for instance, 140° to 150°C. The mixture comprising sublimated molybdenum pentachloride, hydrogen and argon flows through tube 22 into the reactor tube 14. Through branch line 46 is added to the mixture more argon and hydrogen metered by valves 52 and 54, respectively. The mixture flowing into the reactor tube 14 may typically comprise a gas mixture of 97 percent by volume argon and 3 percent by volume hydrogen, flowing at a rate of, for instance, 12 liters per minute. Gas line 22 is provided inside heater 32 to prevent cooling of the mixture flowing therethrough and to prevent condensation of the molybdenum pentachloride. Reactor tube 14, which may, for instance, be made from quartz, has a cross-section much greater than tube 22, thus reducing the flow velocity of the mixture of gas and molybdenum pentachloride. The silicon wafer is heated by heater 15 to the desired deposition temperature. As the mixture contacts the heated silicon wafer 10, reaction takes place and molybdenum silicide is deposited in all areas, where the elementary silicon of the wafer is exposed in the pores. Essentially no reaction and no deposition takes place in those areas of the wafer which are covered by the silicon dioxide layer or by other oxygenated or otherwise non-reactive insulating material.

The rate of deposition of the conductive layer of molybdenum silicide can be readily controlled by varying the flow rate of the gas mixture in relation to the cross-section of the reaction tube, by varying the hydrogen content of the gas mixture, by varying the temperature of heater 32 to control the content of molybdenum pentachloride in the gas mixture and by varying the temperature of the surface of the wafer 10. Typically, the temperature of the wafer surface may be between about 400°C. and about 460°C. Generally preferred is a source of RF power for heating the wafer 10, providing excellent control of the temperature and localizing the heat to the wafer and its surface, where the reaction takes place. Other sources of heat may be used for heating the wafer 10 to the deposition temperature. Typical deposition rates are 1 micron layer thickness per 20 minutes. In this manner, excellent control of the thickness of the deposited layer of contact material may be readily achieved. The spent gas mixture leaves the reaction tube through vent 20.

Figure 2:
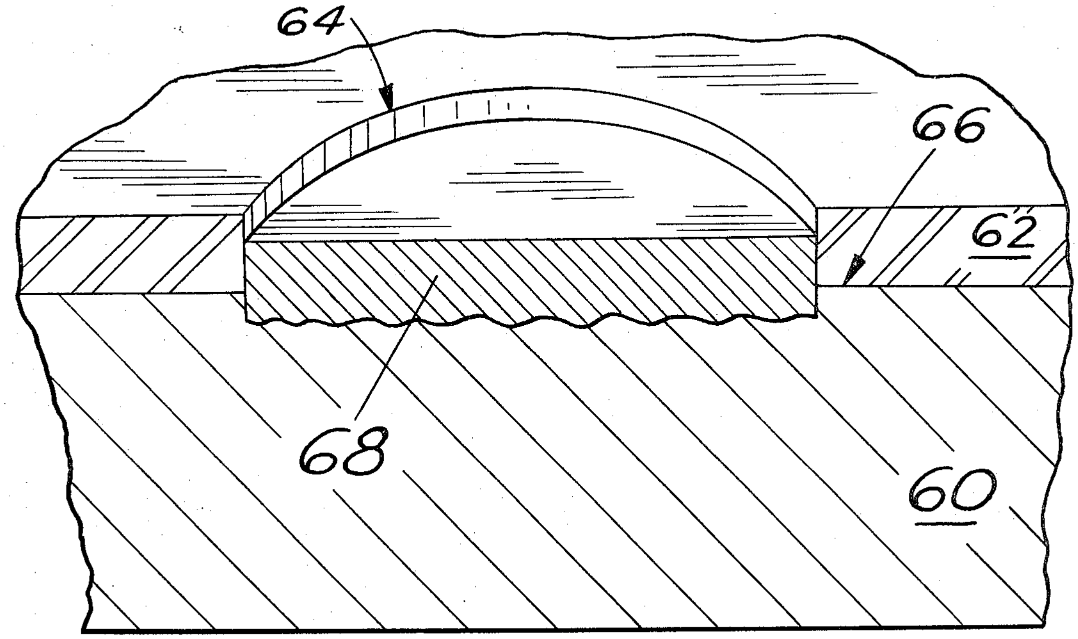
FIG. 2 is an enlarged fragmentary perspective view of a section of a portion of a chip of silicon, comprising a pore into which has been selectively deposited by the method of the invention a conductive layer of molybdenum silicide.

Part of a contact of molybdenum silicides, produced in a pore of a silicon wafer in accordance with the just described method, is illustrated in FIG. 2. Wafer 60 of silicon is provided with a layer 62 of silicon dioxide, into which has been etched pore 64. After etching, pore 64 extends down to the surface of the elementary silicon at the level shown at 66. When the molybdenum silicide layer is selectively deposited in the area of pore 64, the layer 68 of molybdenum silicide grows, as a result of the reaction, into the silicon material extending slightly below the original level 66 of pore 64 as shown. The interface between the molybdenum silicide layer and the silicon in the underlying parts of the wafer is usually ragged and irregular, providing for intimate, increased contact area between the two phases and resulting in excellent adherence of the contact material to the semiconductor silicon. The top surface of the conductive layer 68 is smooth and level. Excellent ohmic contact is achieved solely by the deposition conditions, obviating any further annealing or alloying step. As can be seen in FIG. 2, the molybdenum silicide material builds up in uniform thickness, staying well within the confines of the pore. This is important, because, if the conductor material would grow out of the pore onto the insulator layer 62, short circuits could be formed with any conductor material, which would be deposited onto the insulating layer, for instance, over another layer of semiconductor deposited into the pore on top of the conductor layer 68. The clean deposition of conductor layer 68 makes therefore the wafer, containing it, excellently suited for further processing and building up of more complex multilayer circuitry. As stated above, such clean edged contacts can usually not be achieved by the prior art etching methods and the contacts produced by the method of the invention are therefore also superior in this respect. The selectivity of the method permits to completely fill the pore 64 to the level of the top surface of insulating layer 62, without any of the molybdenum silicide conductor material being deposited on top of the layer 62 of silicon dioxide.

The layer 68 is shown as a unitary layer. Electron diffraction studies have shown that the layer 68 comprises various strata of different molybdenum silicides and often a stratum of a crystalline phase of cubic centered molybdenum metal. $MoSi_2$, $Mo_3Si$ and sometimes Mo have been identified as being present in layer 68. It is believed, that these materials form successive layers, with the $MoSi_2$ layer in contact with the silicon material. Above the $MoSi_2$ layer follows a layer of $Mo_3Si$ and on top may be a layer of metallic molybdenum. No clean line of separation between these layers could be found, and it is believed, that the materials of neighboring layers are mixed at the interface, forming a gradient or gradual compositional change from elementary silicon to the metallic molybdenum, whereby the latter layer of elementary molbydenum is believed to be very thin, forming only a small fraction of the total thickness of layer 68. There are also indications, that a layer of MoSi is present between the layers $MoSi_2$ and $Mo_3Si$.

Typical thicknesses of the layer 68 may range from about 100 Angstroms or less to about 5,000 Angstroms or more. These layer thicknesses provide good ohmic contact and good conductivity and are preferred in the various micro semiconductor devices of the invention. For other applications, conductive layers of greater thickness may be built up by extending the time of the deposition and by controlling the other variables, as set out hereinbefore. In the very thin layer thicknesses of a hundred or a few hundred Angstroms, the layer consists mostly of $MoSi_2$ and is rich in silicon. As the layer becomes thicker, a greater proportion of $Mo_3Si$ is formed. The top layer of molybdenum metal may be absent in the lower range of thicknesses. As the layer thicknesses increase, especially in the very heavy layers, some metallic molybdenum may be found, though even in this case the molybdenum metal layer is usually very thin in relation to the total thickness of the layer. The layer 68 of the ohmic contact material has been shown in FIG. 2 to be lower than the top edge of the layer 62 of insulator. If desired, the pore may be completely filled to the top level of insulating layer 62, by extending the time of deposition.

Typical conductivities of the deposited layers of the just mentioned thicknesses and composition are from 1,000 to 5,000 ohms per square micrometer. With other compositions and layer thicknesses, the conductivity may be higher or lower than the stated range.

The most favorable temperature to which the surface of the silicon wafer is heated for the deposition of the molybdenum silicides was found to be, as stated, from about 400°C. to about 460°C. Depending on the conditions and materials used in the method of the invention, also lower or higher temperatures may be used. With other molybdenum halide compounds, other temperature ranges may be preferred depending on the reactivity of the molybdenum halide. This applies also where halides of other metals are used in the method or where the deposition of the layer 68 is effected onto an electrically resistive material other than silicon.

However, in no event must the temperature of the surface of the silicon wafer or other electrically resistive material be high enough to result in the direct, complete reduction of the molybdenum chloride or other metal halide compound by the hydrogen to the metallic molybdenum or other metal. In this case, metallic molybdenum or other metal in elementary form would be deposited with the loss of the selectivity and of the other benefits of the invention. When other metal halides are used, the reaction temperature, that is the temperature to which the silicon wafer or other electrically resistive material is heated for the reaction to take place, may be higher or lower than the above stated range, however, in any event should the above stated general considerations and limitations be observed.

Similar considerations apply to the sublimation temperature for the molybdenum pentachloride, which has been given herebefore by way of example as being about 140 to 150°C. If lower rates of deposition are desired or if other operating conditions are changed, the molybdenum pentachloride may be heated to lower or higher temperatures, though generally it is not desirable to heat the molybdenum pentachloride in the sublimator 26 to a temperature exceeding the melting temperature of the molybdenum pentachloride (about 202°C.). In other words, it is preferred that the molybdenum pentachloride is admixed to the gas stream by sublimation rather than by evaporization from a liquid melt of the molybdenum pentachloride.

The rate of deposition and the composition and structure of the deposited layer of electrical conductor can be controlled, as stated above, by adjusting the flow rate and composition of the gas mixture in accordance with the requirements of the equipment used in each instance. Generally, excellent results are obtained, if the amount of the hydrogen is adjusted in the range of one one-hundredth to one-tenth of that amount, which would be theoretically required for reducing all of the molybdenum pentachloride, which is carried in the gas mixture, to the molybdenum metal. In other words, there must always be an excess of molybdenum pentachloride over the available hydrogen. On the other hand, at least a small amount of hydrogen gas should be present at all times during the deposition reaction. It is believed, that chlorine is formed in statu nascendi by heat decomposition of the molybdenum pentachloride to form the compound $MoCl_3$ and possibly other molybdenum intermediaries. The chlorine formed in this manner reacts in part with the hydrogen to form HCl and in part with the silicon to form $SiCl_4$ at the surface of the silicon material. Further reaction of the molybdenum intermediaries results in the formation of the molybdenum silicide compounds representing the desired contact material. These reactions are believed to be surface catalyzed reactions taking place at the interface between the silicon or other electrically resistive material and the gaseous reaction mixture, whereby the small amounts of hydrogen being present may serve as a catalyst. The partial pressure of the hydrogen in the gas mixture should be maintained in a range, which favors the formation of the $MoCl_3$ compound. Of course, as the sublimation temperature, to which the molybdenum pentachloride is heated, is increased, resulting in a higher concentration of the molybdenum chloride in the gas phase, the partial pressure of the hydrogen should generally also be increased. The reaction may also follow any other mechanism, and the present invention is not limited to any particular reaction mechanism. The chemical reactions involved in the method of the invention are quite complex and involve apparently a number of successive steps and phenomena, which may vary as the reaction conditions are varied in the manner set out above.

Instead of using argon as the carrier gas, any other noble gas may be used. It is also possible to use as the carrier gas, other indifferent gasses provided they do not take part in the reaction under the particular selected reaction conditions to interfere with the desired deposition of the ohmic conductor material. Under certain conditions, it is also possible to operate the method of the invention without an indifferent carrier gas, using the hydrogen as the carrier for the sublimated molybdenum pentachloride.

Molybdenum halides are the preferred materials for the deposition of the ohmic contact material by the method of the invention. The molybdenum silicides formed at the surface of the silicon and in contact with the edges of the silicon dioxide layer have a thermal expansion coefficient which is very close to the thermal expansion coefficients of silicon and silicon dioxide. The thermal expansion coefficient of molybdenum is $53 \times 10^{-7}$ (cm/cm.°C.). The coefficient of the molybdenum silicides formed in the reaction of the invention is close thereto. This compares favorably with the thermal expansion coefficients of silicon which is $64 \times 10^{-7}$ (cm/cm.°C.) and of silicon dioxide, which is $56 \times 10^{-7}$ (cm/cm.°C.). The closeness of the thermal expansion coefficients permits thermal aftertreatments and fabrication steps or use of the semiconductor devices under conditions involving high temperatures, without the danger of loosening, separation or cracking of the contact material so that the desired ohmic contact is also maintained at relatively high temperatures.

Tungsten has a thermal expansion coefficient of 40 to $45 \times 10^{-7}$ (cm/cm.°C.), with the corresponding tungsten silicides having a coefficient in the same general range. Tungsten halides can therefore be used with similar benefit in the invention.

Contrary to this, aluminum has a thermal expansion coefficient of $230 \times 10^{-7}$ (cm/cm.°C.). The great discrepancy between the coefficients of aluminum and silicon and silicon dioxide make aluminum a less desirable contact material in silicon semiconductor devices.

Other metal halides, which may be used in the invention include tungsten and titanium halides. For operativeness, the metal halides should be volatile and capable of forming subhalide compounds similar as set out hereinbefore for molybdenum. The metal should under the reaction conditions employed in each case also be capable of forming silicides with the silicon substrate or the corresponding metal compounds with the elements making up any other useful non-oxygenated or otherwise reactive electrically resistive material.

Sometimes, it is also possible to use the halides of such metals which are not capable of forming stable subhalides. In this case, it may be desirable to add one or more halogens to the reaction mixture, as may be done also in the case of the molybdenum reaction described above, for further modification of the reaction. The term subhalide as used herein applies to halide compounds of metals which contain chemically bound halogen atoms in a number lower than corresponds to the highest available valency of the metal.

The method has been exemplified hereinbefore by the use of molybdenum pentachloride as the starting material. Other halides such as bromides, iodides, and fluorides may be used, as long as they fulfill the conditions set out hereinbefore. Of course, with other metal halides, the operating conditions may need adjustment to accommodate the special properties of the metal halide used in each case. The above set out general considerations regarding the reaction temperature and sublimation temperature of the metal halide should be observed also with these metals halides, so that the respective metal silicides or other conductive metal are deposited rather than the metal. Examples of metal halides, which may be used with benefit in the method of the invention besides molybdenum pentachloride include molybdenum pentabromide, molybdenum trichloride, tungsten pentachloride, tungsten pentabromide, titanium tetrachloride, and titanium tetrabromide, and many other reducible metal halides. Also the lower halides of the various metals may be used as the starting material particularly if they are used in combination with free halogen as mentioned above or in combination with halogen donating compounds.

The method has been described hereinbefore in connection with silicon being the semiconductor substrate. Any other semiconductor material may likewise be used, provided it is capable of forming with the metal halide used and under the reaction conditions, the corresponding compound of the metal and of the semiconductor material and provided the reaction proceeds in a manner to result in the selective deposition of a reaction product of the metal and the semiconductor material to provide a layer of ohmic contact material solely on the bare surfaces of the semiconductor material. Similar considerations apply, if a reactive insulator material is used as the substrate for the deposition of the conductive layer. The semiconductor material may be also one of the semiconductor memory materials mentioned hereinbefore, provided it is capable of forming a conductive or a non-conductive reaction product with the metal of the metal halide.

Wherever reference is made herein to silicon or elementary silicon, this term includes also mixtures of silicon with other materials, which may likewise be semiconductor materials or conductor materials or insulator materials. These terms include particularly also silicon semiconductor material, which is doped by appropriate additives to generate in the silicon P-type or N-type conductive material or to generate non-conductive or insulator material.

The method of the invention has been described as being selective in the case of a substrate which comprises areas formed by bare reactive semiconductor material alternating with areas covered by a non-reactive insulator material. The invention includes also the situation that the conductive layer is deposited on the surface of a substrate of a reactive semiconductor material forming one continuous area and comprising no non-reactive insulating material on the substrate surface and, vice versa on a continuous surface of a reactive insulating material comprising no non-reactive and/or reactive semiconductor material.

The method of the invention may be beneficially used in the production of all kinds of semiconductor devices. To produce, for instance, a P-N junction diode device from silicon, a chip or wafer of silicon may be appropriately doped to form an area of N-type material. The surface of the chip or wafer may be oxidized in conventional manner to form an insulating coating of silicon dioxide thereon, onto which is applied a photosensitive resist material. After exposure through a suitable mask, removal of the resist material in the unexposed areas, apertures may be etched, for example, with hydrofluoric acid, through the silicon dioxide layer and extending down to the silicon sublayer to produce a surface of silicon in the exposed areas and to form pores in the desired areas, to which electrical contact is to be made. After removal of the photoresist material adhering to the remaining silicon dioxide layer, a suitable doping agent is applied through the respective pores to form P-junction material in the areas underlying the pores. Thereafter, the chip or wafer is placed in a deposition apparatus, for instance, in an apparatus as illustrated in FIG. 1 and a conductive layer, preferably consisting of molybdenum silicides or tungsten silicides is deposited into the pores in ohmic contact with the underlying junction material in a manner as described hereinbefore. Suitable electrical connections may be made to the conductive metal silicide layer deposited in this manner to form a diode device ready for use. In a similar manner other active electrical devices such as transistors, may be readily produced. The method of the invention is particularly beneficial, if a large number of extremely small devices are to be combined on a common substrate for the production of micro circuits.

Figure 3:
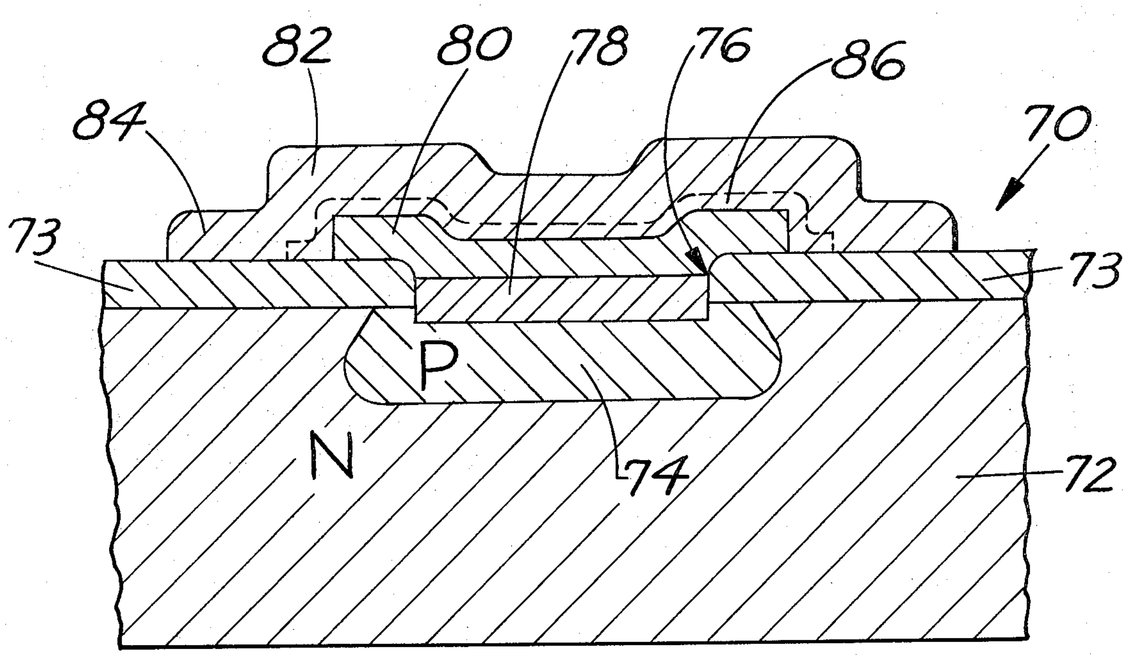
FIG. 3 is a schematic vertical sectional view of a new vertically stacked semiconductor device incorporating the conductor made by the method of the present invention.

The method of the invention may with particular benefit be employed in the manufacture of so-called vertically stacked devices. A vertically stacked device comprising a memory switch is illustrated, by way of example of this type of device, in FIG. 3. The device, generally indicated by 70 comprises a layer 72 of a semiconductor material, such as a chip or wafer of silicon. The top surface of the silicon wafer is provided with an insulating layer 73, which may conveniently be produced by oxidation of the top layer of the silicon material in the manner described hereintofor. In the insulating layer is produced a pore 76, for instance, in the manner described hereinbefore by the the use of a photoresist material and of hydrofluoric acid as an etching agent. Through the pore 76 is thereafter applied suitable doping agent to region 74 of the layer 72 to the semiconductor material to form a P-N junction as shown. Thereafter conductive layer 78 of stratified metal silicides, preferably of molybdenum silicides or tungsten silicides is provided in aperture 76 by the method of the invention as described hereintofor. This layer 78 is in ohmic contact with the P-type material and has been selectively deposited as described hereinbefore. The conductive layer 78 is confined to the pore 76 and no conductive metal silicides have been deposited on the surface of layer 73 of insulator. This is important, as will be shown hereinafter, to avoid the formation of short circuits. Upon conductive layer 78 of metal silicides is provided a layer 80 of a semiconductor memory material. This semiconductor memory material may preferably be one of the semiconductor materials disclosed and claimed in U.S. Pat. No. 3,271,591 granted on Sept. 6, 1966, to S. R. Ovshinsky or one of the memory semiconductor materials described and disclosed in U.S. Pat. No. 3,530,441 granted on Sept. 22, 1970, to S. R. Ovshinsky. Any other semiconductor material, which is capable of switching in response to electrical energy above a certain threshold value between a state of lesser conductivity and a state of higher conductivity or any other material forming an active or passive electrical element may likewise be used as the material making up layer 80. For best results, layer 80 of memory material is of uniform predetermined thickness and extends somewhat beyond the confines of the aperture 76. This assures conductivity of a predetermined value all over the cross section of the pore 76 and minimizes the possibility of thread formation and the formation of a short circuit. The layer 80 of memory material may be produced by vacuum deposition or sputtering, or by similar methods, followed by a photoresist etching step as described above, to leave layer 80 of a size and in a position as may be desired.

If the semiconductor memory material is directly deposited onto and in contact with the silicon semiconductor material to provide, for instance, a switch device or other active device, silicon may, during the electrical cycling of the device, diffuse into the memory material, gradually lowering its effectiveness. It was found, that the presence of the intermediary conductive contact layer 78 of metal silicides deposited by the method of the invention prevents the diffusion of silicon into the layer 80 of semiconductor memory material, thereby increasing the life of the memory switch or of other active devices deposited on the silicon semiconductor substrate and leaving their electrical values unchanged over a long life of the component.

In contact with layer 80 of memory material is provided a layer 82 of a conductor material, usually metal, such as aluminum. The aluminum layer may be provided in conventional manner for example, by evaporation techniques followed by a photoresist etch step as described hereintofor. It is to be noted, that conductive layer 82 extends all around layer 80 of memory material with a flange portion 84 in contact with the insulating layer 73. Since aluminum has a tendency of diffusing into the memory material of layer 80 it is preferred, in the case of using aluminum in conductive layer 82, to provide a thin intermediary layer 86 of another conductive material as indicated by the broken lines. This layer 86 may be made, for instance, from molybdenum or similar indifferent metal and may be very thin, merely serving as a diffusion barrier between the aluminum and the memory material.

Instead of providing in layer 72 a diode type device, a transistor device may be incorporated, for instance, in the manner shown and described in co-pending application Ser. No. 887,076, filed on Dec. 22, 1969, in the name of Ronald G. Neale and entitled "Combination Film Deposited Switch Unit and Integrated Circuit".

Hereinbefore, a single unit of a vertically stacked device has been described. By providing a plurality of these devices in a common matrix and adding a system of X and Y conductors into which the stacked memory switching devices described hereinbefore are electrically connected, integrated circuits are formed, which may be used for storing and retrieving information, for instance, in computers. These devices may have the general construction and may be operated in a manner described in said co-pending application Ser. No. 887,076. By using the stacked configuration described hereinbefore in combination with the metal silicide contact layer 78 of the invention, arrays of electrical devices of excellent electrical performance, long life, highest compactness and of low manufacturing cost are obtained.

The new method of the invention makes it possible to place an electrical conductor connecting different devices, such as an X or Y conductor directly over the electrical device. This embodiment of the method of the invention is demonstrated in the device illustrated in FIG. 4, using molybdenum pentachloride as the metal halide compound.

Figure 4:
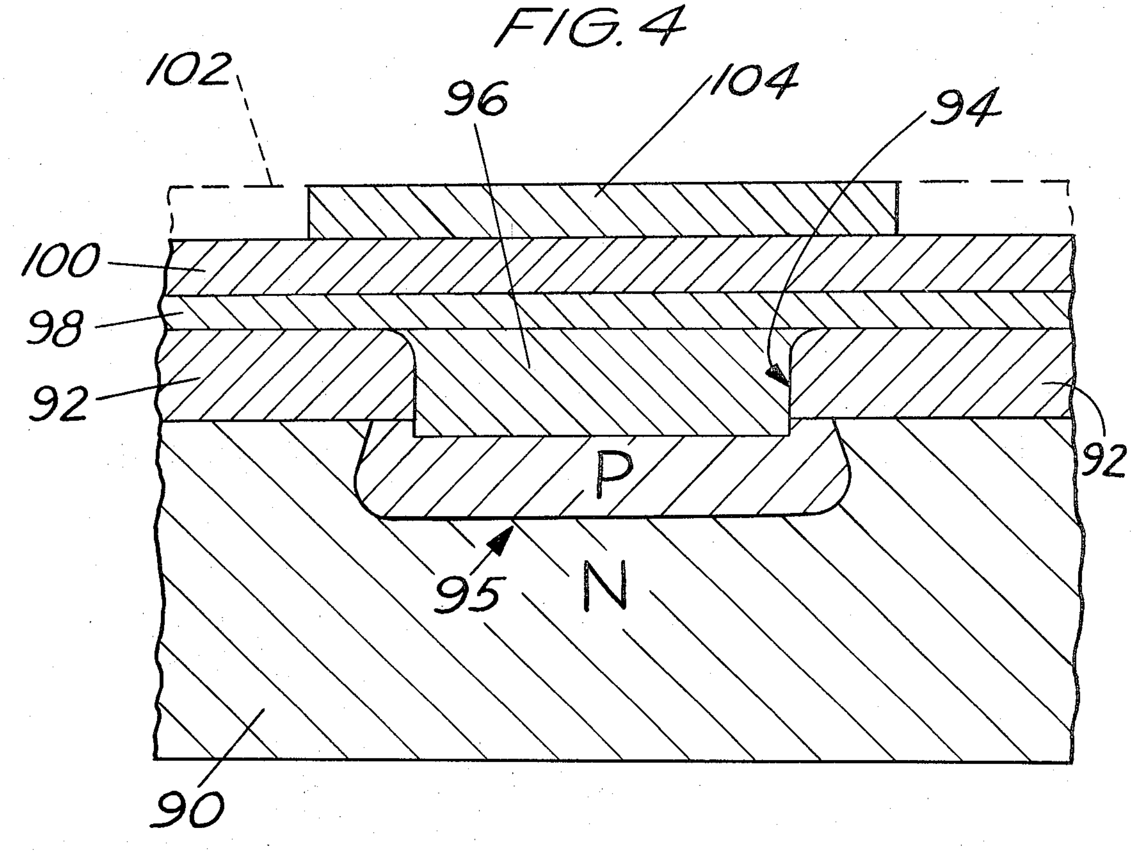
FIG. 4 is a schematic, vertical sectional view of an active device comprising an X-conductor and insulated therefrom a Y-conductor, both running and crossing in a position above the active device.

Substrate 90 is comprised, for instance, of a silicon wafer covered by an insulating layer 92 of silicon dioxide. At 94 a pore is etched, in the manner described before, through which a doping agent is applied to the silicon substrate to form a P-N junction device 95 under the pore 94 as shown. Into the pore 94 is thereafter selectively deposited a layer 96 of molybdenum silicide in a manner as described hereinbefore to provide ohmic contact with the P-junction material in the silicon substrate. When the pore 94 is filled with the molybdenum silicide ohmic contact material, the deposition conditions, for example, in an apparatus, as shown in FIG. 1 may be changed, without removing the silicon wafer from the device, to result in the deposition of metallic molybdenum. This may be achieved, for instance, by increasing the ratio of hydrogen in the gas mixture as explained above and by increasing the temperature of the wafer to a temperature above 500°C. but below 800°C. Thereby a layer of metallic molybdenum 98 is deposited onto the ohmic contact material 96 (consisting of molybdenum silicides) and all over the surface of the insulator layer 92. After deposition of a sufficiently thick layer of metallic molybdenum, the wafer is removed from the apparatus and by the application of a photoresist material and selective etching in conventional manner, with subsequent removal of the remaining photoresist material, the X-conductor is formed consisting of the desired portion of layer 98. The X-conductor is shown in FIG. 4 to extend parallel to the paper plane. Thereafter, another layer 100 of insulating material such as silicon dioxide, is applied over the wafer, and as needed, pores are etched into this insulating layer 100 to bare underlying devices (not shown) or ohmic contacts of molybdenum silicides, applied in the first deposition step onto other devices (not shown). Molybdenum silicide is thereafter deposited into the pores in accordance with the method of the invention to provide the required ohmic contact with underlying devices. Thereafter another layer 102 of metallic molybdenum is applied in the manner described hereinbefore, and by selective etching in known manner, e.g. by the use of the photoresist method, Y-conductor 104 is formed, electrically connecting other devices (not shown), whereby the X-conductors and Y-conductors are properly insulated from each other. The Y-conductor 104 extends in a plane perpendicular to the paper plane. If, in another device (not shown) the Y-conductor 104 is to be electrically connected, e.g. to a layer of molybdenum silicide contained thereon, a pore is provided in insulating layer 100, which may also be filled with molybdenum silicide to provide direct contact with the Y conductor. In this case, any X-conductor crossing over the device is formed e.g. as an O with the device or contact in the center to by-pass this device.

It can be seen from FIG. 4, that the X-conductor as well as the Y-conductor are placed directly above the P-N junction device 95. This arrangement makes possible a great increase of package density in devices, which contain a large number of active and/or inactive devices.

Heretofore, in devices of this kind, using for ohmic contact aluminum or the like, the X- and Y-conductors were usually placed beside the devices. This was desirable because the aluminum contacts after alloying, were ragged at their surface, making it impossible or difficult to deposit the X- and Y-conductors directly thereon. The side by side arrangement of the prior art provides also for better dissipation of heat generated in the devices, and in the conductors. Because of the above described mismatch of thermal expansion coefficients in the case of aluminum contacts, it was important in the devices of the prior art, to provide for effective dissipation of the generated heat and to assure generally cool operation of the array of devices in order to avoid heat damage during the operation of the array.

With arrays of electrical devices, designed in accordance with the invention, as illustrated, for instance in FIG. 4, the problem of heat dissipation has become a minor one. The better quality of ohmic contact provided by the molybdenum silicide deposit reduces the generated heat. Furthermore, all components and elements in the arrays constructed in accordance with the invention, are capable of withstanding high heat conditions per se, and since all materials used in the arrays have very close thermal expansion coefficients, the device can be operated at higher temperatures without damage thereto and without substantial shortening of the life of these devices. The use of the new molybdenum silicide ohmic contacts and the use of the method of the invention make therefore possible more compact arrays using less space for a given number of devices and connections, without detriment to their operational characteristics and without undue shortening of the use life of the arrays of the invention.

The principles set out hereinbefore with respect to the arrangement of the X- and Y-conductors above the active elements may be applied in similar manner for the making of the most complex, large scale integrated circuits and micro circuits. The connections between the various active elements and passive elements may be provided in the manner set out in connection with FIG. 4. Principally, this involves providing the active devices in accordance with the invention with molybdenum silicide or other metal compound ohmic contacts and applying step by step and alternatingly layers of insulators and layers of metallic conductors, in each step etching apertures through the insulator layer when connection to an underlying active device is desired, thereby making the electrical connection in the pore by the selective deposition of the ohmic conductor, such as molybdenum silicides, by the method of the invention, applying a layer of conductive metal thereover, and removing in conventional manner all parts of the metallic conductor layer where it is not needed or desired to form the electric connections between the various active and/or passive devices in the array. In this manner, a large number of insulating layers and many different conductors may be placed one on top of the other to achieve all the desired electrical connections. Of course, where a conductor in a higher level is to be connected through suitable pores in the insulator layers, to a given active device, lower lying conductors, not to be connected to this particular device, by-pass the device, for example by giving the conductor at this position the form of an O with the active device placed in the non-conductive center of the O.

The application of these principles provides unlimited freedom in the design of the most complex circuitry in closest space to provide greatest packing density. The active devices or elements, and if desired some of the passive devices or elements may all be placed into a silicon wafer, while the remaining passive elements, the ohmic contacts provided by the method of the invention and the electrical connections may be contained in a multiplicity of layers above the wafer as has been set out hereinabove.

In view of the close similarity of the thermal expansion coefficients of the various materials used, the devices are, regardless of their size and complexity, durable and do not fail due to thermal mismatch, as has been the case with the materials used hereinbefore, when the design of such closely packed, complex devices was attempted with the materials and in accordance with the methods of the prior art.

The foregoing description of the method and devices of the invention is merely by way of example. Other devices may be designed and made in any other desired manner, using the basic concepts of the invention of selectively depositing a molybdenum silicide ohmic contact, having a gradient of strata of differing silicon content as has been set out herebefore. The invention has been described on the basis of molybdenum and silicon as the reactants in the reaction. As stated, other metals, such as tungsten may be used, and the method may be successfully practiced with substrates of semiconductor and insulator materials other than silicon.

Numerous other modifications may be made to various forms of the invention described herein without departing from the spirit and scope of the invention.

I claim:

1. In a method for producing an electrical device the step of providing a surface, which comprises in at least one area a first electrically resistive material and in at least one other area a second electrically resistive material, the step of contacting said surface with a mixture comprising a hydrogen reducible metal halide and an amount of gaseous hydrogen, which is insufficient for the complete reduction of said metal halide to the metallic form, and the step of heating said surface, while it is contacted by said mixture, to a reaction temperature, which is lower than the temperature, which is required for the reduction of said metal halide to the metal, said first electrically resistive material being a material, which is capable of reacting with said mixture at said reaction temperature, and said second electrically resistive material being a material which is not capable of reacting with said mixture at said reaction temperature, thereby selectively depositing an electrically conductive layer of a metal reaction product of the mixture with the first electrically resistive material on the surface in the areas, which are formed by said first electrically resistive material and no layer is deposited on the surface in the areas which are formed by said second electrically resistive material.

2. In a method for producing an electrical device the step of providing a surface of a semiconductor material, the step of providing on part of the said surface of said semiconductor material a layer of an insulator material forming an insulating surface, the step of contacting said surface comprising said semiconductor material and said insulating surface with a mixture comprising a hydrogen reducible metal halide and an amount of gaseous hydrogen, which is insufficient for the complete reduction of said meta halide to the metallic form, and the step of heating said surface comprising said semiconductor material and said insulator material, while it is contacted by said mixture, to a reaction temperature, which is lower than the temperature which is required for the reduction of said metal halide to the metal, thereby selectively depositing an electrically conductive layer of a metal reaction product of the mixture with the semiconductor material on the surface formed by said semiconductor material and depositing no electrically conductive layer on said insulating surface.

3. The method of claim 2, in which an electrically conductive layer comprising metal silicides is selectively deposited on a surface formed by a material comprising silicon and no electrically conductive layer is deposited on a surface formed by oxidized silicon.

4. The method of claim 3, in which said surface is contacted with a mixture containing a molybdenum halide compound and in which a layer comprising molybdenum silicides is selectively deposited on said surface comprising silicon and no electrically conductive layer is deposited on the surface formed by said oxidized silicon.

5. The method of claim 3, in which an electrically conductive layer is deposited which comprises superimposed layers of at least two different metal silicides.

6. A method for producing an electrically conductive layer which method comprises:

the step of providing a surface of an electrically resistive material, the step of contacting said surface with a mixture comprising a hydrogen reducible metal halide, which is capable of forming at least one subhalide, said mixture comprising further an amount of gaseous hydrogen, which is insufficient for the complete reduction of said metal halide to the metallic form, and the step of heating said surface of the electrically resistive material, while it is contacted by said mixture, to a temperature, which is at least high enough to permit the formation of a metal reaction product with said electrically resistive material but lower than is required for the reduction of said metal halide by hydrogen to the respective metal, thereby depositing a conductive layer of said metal reaction product onto said surface of electrically resistive material.

7. The method of claim 6, in which the surface of an electrically resistive material, which is a reactive semiconductor material, is contacted with said mixture, thereby depositing said electrically conductive layer on the surface of said semiconductor material.

8. The method of claim 6, in which said surface contacted with said mixture comprises at least one area of reactive semiconductor material alternating with at least one area comprising a non-reactive insulator material, and in which said conductive layer is deposited selectively in the areas formed by said semiconductor material, and no conductive layer is deposited in the areas formed by said insulator material.

9. The method of claim 6, in which a surface of silicon is contacted with said mixture comprising said metal halide and hydrogen.

10. The method of claim 6, in which said surface is contacted with a mixture comprising a halide of a metal selected from the group consisting of tungsten and molybdenum.

11. The method of claim 6, in which elementary halogen is added to said mixture.

12. The method of claim 10, in which said surface of said electrically resistive material is heated to a temperature from about 400°C. to about 460°C. while it is contacted with said mixture.

13. The method of claim 6, in which said surface is contacted with a mixture which comprises in addition an inert carrier gas.

14. The method of claim 6, in which said surface is contacted with a mixture which comprises in addition a noble gas as a carrier gas.

15. A method for producing a conductive layer, which method comprises:

the step of providing a surface of a silicon material, the step of contacting said surface with a mixture comprising a molybdenum halide and gaseous hydrogen in an amount which is insufficient for the complete reduction of said molybdenum halide to metallic molybdenum, and the step of heating said surface while it is contacted with said reaction mixture to a reaction temperature which is substantially lower than the temperature, at which the molybdenum is reduced to the metallic form, to form a layer of a reaction product of molybdenum silicide on said silicon material.

16. The method of claim 15, in which said surface of said silicon material is heated to a temperature from about 400°C. to about 460°C., while it is contacted with said mixture.

17. The method of claim 15, in which said surface of said silicon material is contacted with a mixture which comprises in addition a noble gas as a carrier gas.

18. The method of claim 15, in which said surface of silicon material is contacted with a mixture which comprises from about one one hundredth to about one tenth the amount of hydrogen which is required for reducing all of the molybdenum halide contained in the mixture to metallic molybdenum.

19. The method of claim 15, in which said surface of silicon material is contacted with a mixture which comprises molybdenum pentachloride and hydrogen.

20. The method of claim 18, in which said surface of silicon material is contacted with a mixture which comprises molybdenum pentachloride, hydrogen and a noble gas as a carrier gas.

21. The method of claim 15, in which said surface of the silicon material comprises at least one area comprising elementary silicon and at least one area of silicon in oxidized form, and in which both types of areas are heated and contacted by said gaseous mixture, thereby selectively depositing a conductive layer of molybdenum silicides on the surface of the areas comprising elementary silicon and depositing no conductive layer on said areas of silicon in oxidized form.

22. A method for producing a conductive layer, which method comprises: the step of providing a surface of an electrically resistive material, the step of contacting said surface with a mixture comprising a metal halide, which is capable of forming a metal compound with said electrically resistive material, and which metal halide is capable of being reduced by hydrogen in the vapor phase, said mixture comprising further an amount of gaseous hydrogen which is insufficient for the reduction of said metal halide to the respective metal, and the step of heating said surface of the electrically resistive material, while it is contacted by said mixture, to a reaction temperature, which is lower than the temperature which is required for the reduction of said metal halide to the metal thereby depositing a conductive layer of a metal reaction product onto said surface of electrically resistive material.

23. The method of claim 22, in which a surface of silicon is contacted by said mixture. mixture which 24. The method of claim 22, in which the surface of said electrically resistive material is contacted by a mixturewhich comprises a halide of a metal selected from the group consisting of molybdenum and tungsten.

25. The method of claim 22, in which the surface of an electrically resistive material, which is a reactive semiconductor material, is contacted with said mixture, thereby depositing said electrically conductive layer on the surface of said semiconductor material.

26. The method of claim 22, in which said surface comprises at least one area of a semiconductor material, which is capable of reacting with said mixture of said reaction temperature, and at least one area of an insulator material, which is incapable of reacting with said mixture at said reaction temperature, thereby forming a conductive layer of a partial metal reaction product on the surface of the areas of semiconductor material and forming no conductive layer on the surface of the areas of insulator material.

* * * * *